(12) United States Patent
Zeighami

(10) Patent No.: US 6,989,623 B2
(45) Date of Patent: Jan. 24, 2006

(54) METHOD AND APPARATUS FOR MEASUREMENT USING PIEZOELECTRIC SENSOR

(75) Inventor: Roy Zeighami, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 79 days.

(21) Appl. No.: 10/735,197

(22) Filed: Dec. 12, 2003

(65) Prior Publication Data

US 2005/0127785 A1    Jun. 16, 2005

(51) Int. Cl.
*H01L 41/08*    (2006.01)

(52) U.S. Cl. .................. 310/317; 319/319; 319/328
(58) Field of Classification Search ................ 310/317, 310/319, 328, 377; 324/117 R, 109

See application file for complete search history.

(56) References Cited

U.S. PATENT DOCUMENTS

| | | | | |
|---|---|---|---|---|
| 3,997,839 A | * | 12/1976 | Dreyfus et al. | 324/109 |
| 4,500,838 A | * | 2/1985 | Bloomer | 324/117 R |
| 4,528,502 A | * | 7/1985 | Rocha | 324/117 R |
| 5,053,693 A | * | 10/1991 | Bohnert et al. | 324/96 |
| 5,404,064 A | * | 4/1995 | Mermelstein et al. | 310/319 |
| 5,696,491 A | * | 12/1997 | White et al. | 340/657 |

* cited by examiner

*Primary Examiner*—Mark Budd

(57) ABSTRACT

A method and apparatus for measuring electrical current using a piezoelectric sensor. A first electrical conductor for carrying a current to be sensed is attached to one face of a piezoelectric element. A second electrical conductor for carrying a reference current, the second electrical conductor is attached to the opposite face of the piezoelectric element and is aligned parallel to the first electrical conductor. The force between the first and second electrical conductors is applied to the piezoelectric element and produces an electrical potential between the faces of the piezoelectric element. The electrical potential may be used to determine the current in the first conductor.

33 Claims, 6 Drawing Sheets

METHOD AND APPARATUS FOR MEASUREMENT USING PIEZOELECTRIC SENSOR

FIELD OF THE INVENTION

This invention relates generally to the field of electrical measurement. More particularly, this invention relates to a method and apparatus for measurement using a piezoelectric sensor.

BACKGROUND

A variety of techniques are used for measuring electrical current in a conductor. One technique is to allow some or all of the current to flow through a resistor and to measure the voltage-drop across the resistor. Ohm's law may then be used to calculate the current. If the resistor is in series with the conductor this will produce a voltage drop in the circuit, which is often undesirable. In addition, the resistance of the resistor is not easily altered, so dynamic change of the sensitivity of the sensor is difficult to achieve.

A second technique uses a current transformer, but this approach is expensive and can only be used with alternating currents. Another technique uses an open-loop or closed-loop Hall effect sensor. A current flowing through a conductor produces a magnetic field. The magnetic field may be concentrated by placing a magnetic core around the conductor. A Hall effect sensor placed in a gap in the magnetic core is used to measure the strength of the magnetic field. The magnetic core is required because of the low sensitivity of the Hall effect sensor and limits the miniaturization of the sensor.

Yet another technique uses a magneto-resistive sensor. A magneto-resistive sensor is a device that changes its resistance in the presence of a magnetic field. Like a Hall sensor, it can be used to measure the magnetic field produced by a current. However, it is more sensitive and may be used without a magnetic core to concentrate the magnetic field. A disadvantage of this approach is that the resistance change of a magneto-resistive material is not sensitive to polarity, so the direction or phase of the current flow cannot be determined. Further disadvantages include a limited linear range and poor temperature characteristics.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
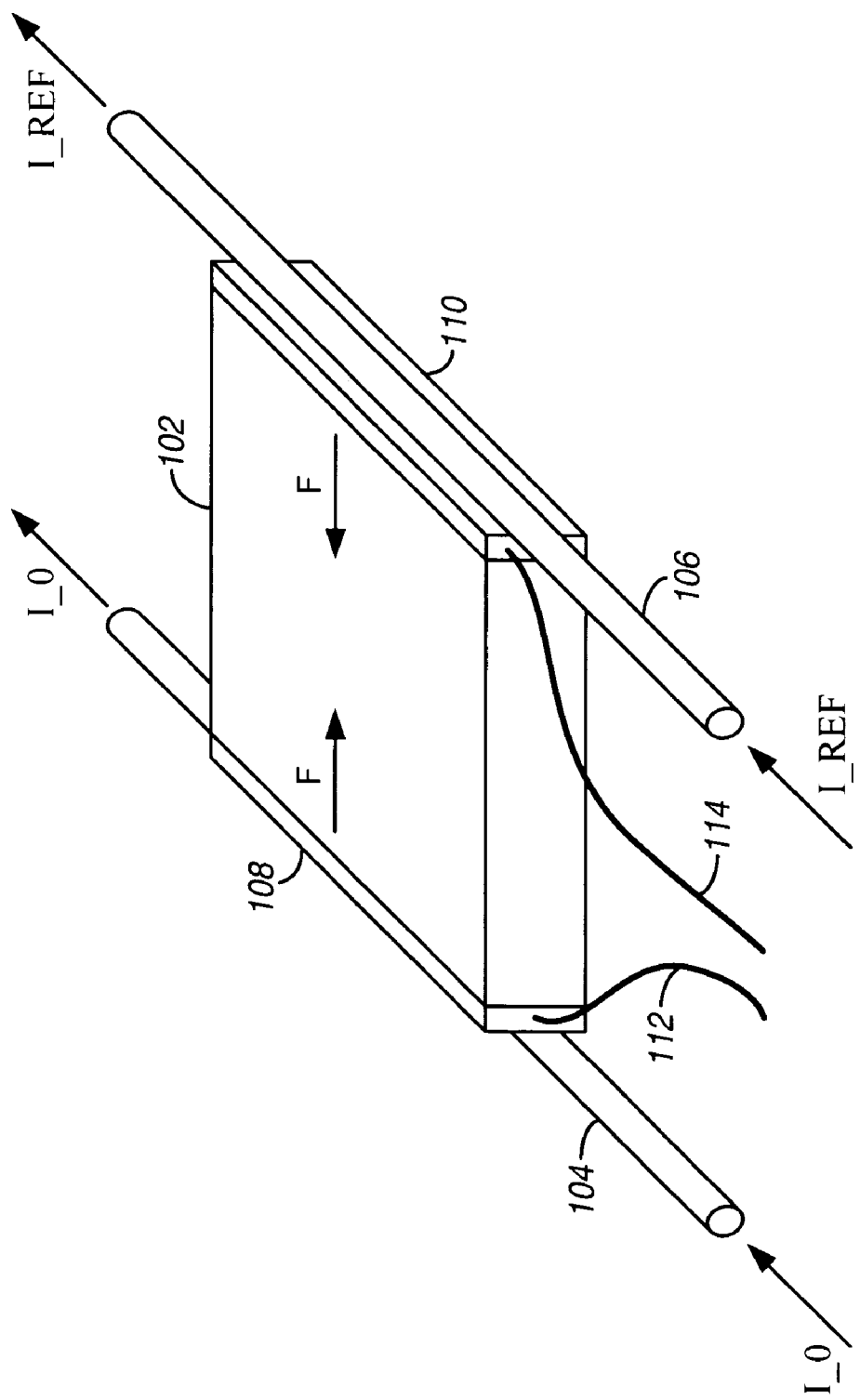
FIG. 1 is a diagrammatic representation of a piezoelectric sensor in accordance with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several Views of the drawings.

When currents flow in the same direction in two parallel electrical conductors, an attractive force is produced between the conductors. This property is used in the SI (System International) measurement system to relate electrical current to reference units of space, time and mass. The unit of electrical current is the ampere. In the SI measurement system, an ampere is defined to be that constant current which, if maintained in two straight parallel conductors of infinite length, of negligible circular cross-section and placed one meter apart in a vacuum, would produce between these conductors a force of $2 \times 10^{-7}$ Newton per meter of length.

One aspect of the present invention is the use of a piezoelectric element between two electrical conductors to sense the force between the conductors. If the current in one of the conductors is a known reference current, then the current in the other conductor may be determined from the reference current and the force between the conductors.

FIG. 1 shows a piezoelectric current sensor in accordance with one embodiment of the present invention. Referring to FIG. 1, a piezoelectric element 102 is positioned between a first electrical conductor 104 and a second electrical conductor 106. The current to be sensed, denoted by I_0 in the figure, is passed through the first conductor 104, while a reference current, denoted by I_REF in the figure, is passed through the second conductor 106. When the currents flow in the same direction, an attractive force, F, is produced between the two conductors. This force is transferred to the piezoelectric element 102. The piezoelectric element 102 contains a piezoelectric material, such as quartz crystal, lead zirconate titanate (PZT) ceramic or polyvinylidene fluoride (PVDF) polymer. When a piezoelectric material is strained, opposite charges are produced on two of its faces. In the embodiment shown in FIG. 1, the two faces are covered with conductive layers 108 and 110 that collect the charge on each face. The conductive layers may be silver or gold, for example. Connecting wires 112 and 114 are electrically coupled to the conductive layers 108 and 110 respectively. The wires may be attached to the layers by a variety of means including soldering or bonding with a conductive epoxy. These connecting wires 112 and 114 may be coupled to a charge amplifier to provide a signal that is used to measure the electrical potential between the two surfaces, and hence the strain of the piezoelectric element. The strain is directly related to the stress (force) applied to the material, so the piezoelectric element 102 may be used as a force sensor to measure the force between the two conductors 104 and 106. The conductors may be electrically isolated from the conductive layers. For example, this may be done by use of an insulating layer, such as a silicon nitride layer, between the conductor and the layer, by use of a non-conductive bonding material or by use of insulated conductors.

In general, the force acting on the piezoelectric element is given by $$F = \frac{\mu \cdot l \cdot I_{REF}}{2\pi r} I_0$$

where $\mu$ is the effective permeability of the region surrounding the conductors, r is the separation of the two conductors, l is the length of the conductors in contact with the piezoelectric element, $I_{REF}$ is the reference current and $I_0$ is the current to be measured. The sensitivity of the sensor is determined by the dimensions of the piezoelectric element (l and d) and by the reference current, $I_{REF}$. The resulting charge per unit area on the surface of the piezoelectric element is given by $$D = dT + \epsilon E,$$

where d is the piezoelectric constant, T is the stress (force per unit area) on the peizoelectric element, $\epsilon$ is the permittivity of the element under constant stress and E is the electric field. If the force is assumed to be evenly distributed across the face of the piezoelectric element, the charge per unit area on the surface of the piezoelectric element is $$D = \frac{dF}{l \cdot h} + \varepsilon E,$$

where h is the thickness of the piezoelectric element. The total charge in the absence of an electric field is therefore $$c = dF = d\frac{\mu \cdot l \cdot I_{REF}}{2\pi r} I_0.$$

Hence, the charge produced across the piezoelectric element is proportional to the current $I_0$ in the first conductor. In practice, the constant values in the above equation may be difficult to determine, so the device may be calibrated by measuring the charge produced by one or more known currents.

The measured current is given by $$I_0 = c \frac{2\pi r}{\mu \cdot dl \cdot I_{REF}}.$$

The voltage $V_0$ output from the charge amplifier is proportional to the electric potential (difference in charge) between the two faces of the piezoelectric element, so in general, $$I_0 = \alpha \frac{V_0}{I_{REF}},$$

where $\alpha$ is a calibration constant, which can be calculated as $$\alpha = \frac{I_0 \cdot I_{REF}}{V_0}$$

for known currents and a measured voltage.

In one embodiment, the reference current flows through a fixed resistance or is generated by a power supply responsive to an applied voltage. The reference current is proportional to the voltage $V_{REF}$ applied to the circuit. This gives the relationship between the measured current and the reference voltage as $$I_0 = \beta \frac{V_0}{V_{REF}},$$

where $\beta$ is a calibration constant. For example, if $V_{REF}=50$ if $I_0=1$A produces a voltage of 2V from the charge amplifier during calibration, then the calibration constant is calculated as $$\beta = I_0 \frac{V_{REF}}{V_0} = 1 \cdot \frac{50}{2} = 25 \text{ A}.$$

If, in operation, $V_{REF}=25$ and the output of the charge amplifer is a voltage of 0.3V, the measured current is determined to be $$I_0 = \beta \frac{V_0}{V_{REF}} = 25 \cdot \frac{0.3}{25} = 0.3 \text{ A}.$$

In a further embodiment, the reference current or applied voltage is fixed, so that the measured current is given by $$I_0 = \gamma V_0,$$

where $\gamma$ is a calibration constant.

When the electrical resistance of the first conductor is known, the voltage across the terminals of the conductor may be calculated from the sensed current using Ohm's law. Hence, the current sensor may also be used to measure voltage.

Figure 2:
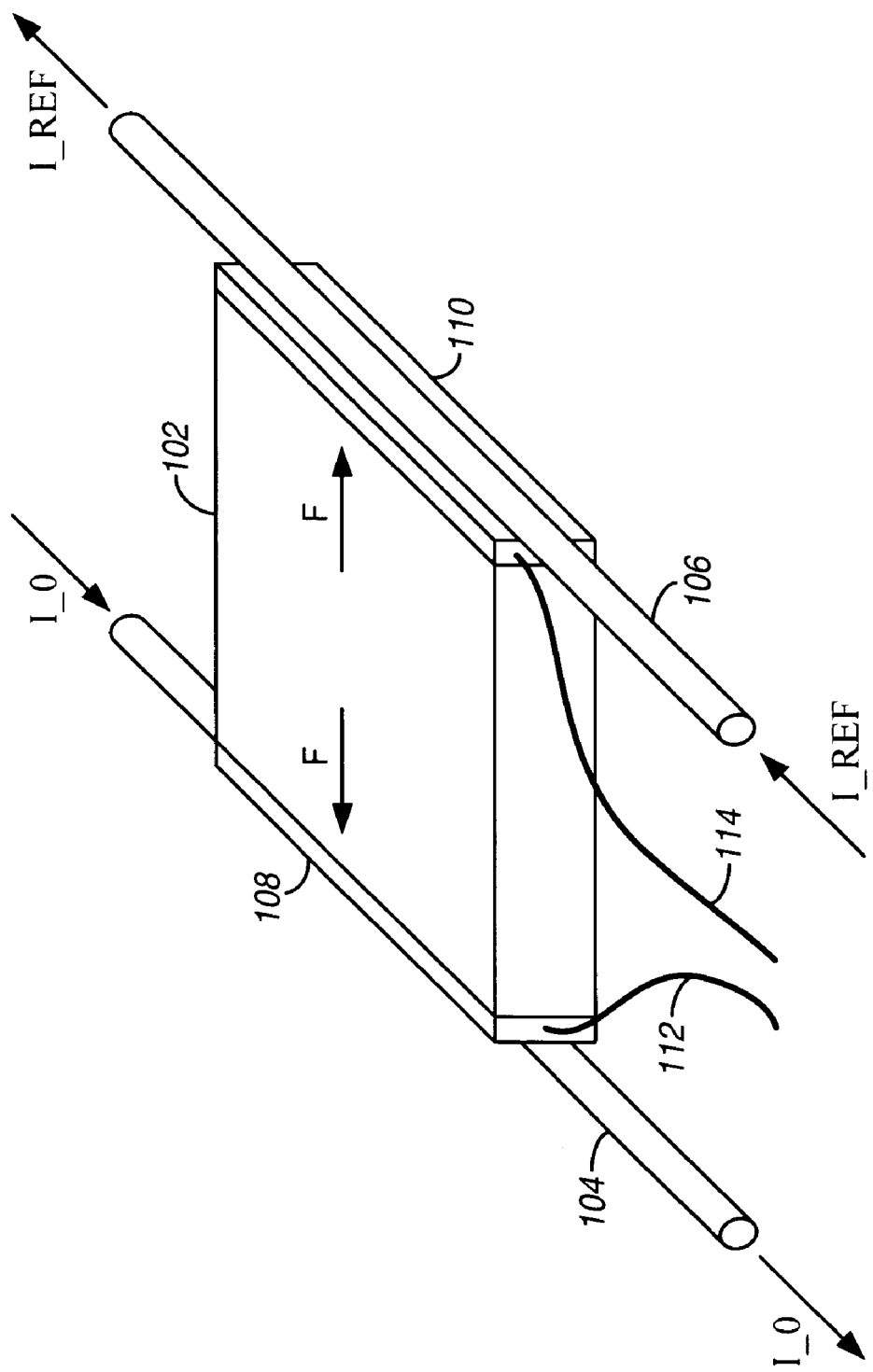
FIG. 2 is a diagrammatic representation of a piezoelectric sensor in accordance with certain other embodiments of the present invention.

When currents flow in opposite directions in two parallel electrical conductors, as shown in FIG. 2, a repulsive force F is produced between the conductors. The conductors 104 and 106 are bonded to the conductive layers 108 and 110 or the piezoelectric element, so the repulsive force produces an extensive strain on the piezoelectric element 102. In turn, this produces opposite charges on the conducting layers 108 and 110. The charges may be measured to determine the strain and thereby determine the force between the conductors and the current flowing through the conductors. Hence, the piezoelectric current sensor can be used to determine both the amplitude and direction (polarity) of the current in the conductor 104.

Figure 3:
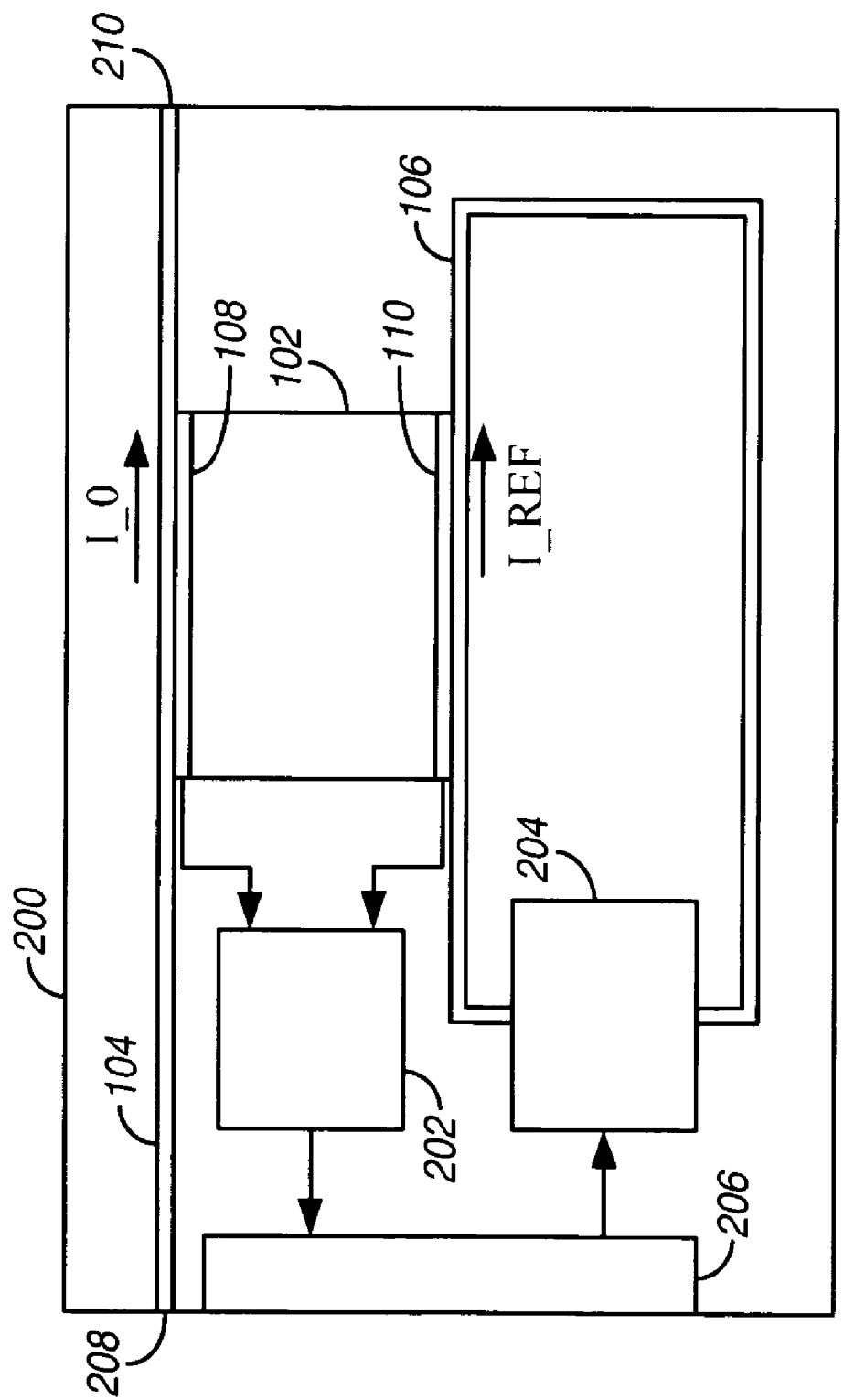
FIG. 3 is diagrammatic representation of a device incorporating a piezoelectric sensor in accordance with certain embodiments of the present invention.

FIG. 3 shows a current sensing device in accordance with one embodiment of the present invention. The current sensing device is formed on a substrate 200 and has a piezoelectric current sensor. Conductive layers 108 and 110 are attached to opposite faces of a piezoelectric element 102. Conductors 104 and 106 are bonded to the conductive layers, or directly to the piezoelectric element. The charge from the conductive layers is collected by charge amplifier 202 to produce a signal representative of the force on the piezoelectric element. A current source, or, equivalently, a power supply, 204 generates a reference current I_REF in the second conductor 106. Interface or connector 206 coupled to the charge amplifier 202 and the current source (power supply) 204 may be used to pass the signal representative of the force to an external monitoring device. The interface may also be used to pass a control signal to the current source 204 to control the level of the reference current, I_REF. The force on the piezoelectric element 102 is related to the reference current, so the sensitivity of the piezoelectric current sensor may be adjusted by altering the reference current. The current to be measured is coupled to the device at current input 208 and leaves the device at current output 210.

The interface 206 may contain digital or analog circuitry to determine the current I_REF. The interface 206 may also contain digital or analog circuitry to adjust the current I_REF automatically and thereby control the sensitivity of the current sensor. Power to the device, which is used by the charge amplifier 202 and by the current source 204, may also be supplied through the interface 206.

Figure 4:
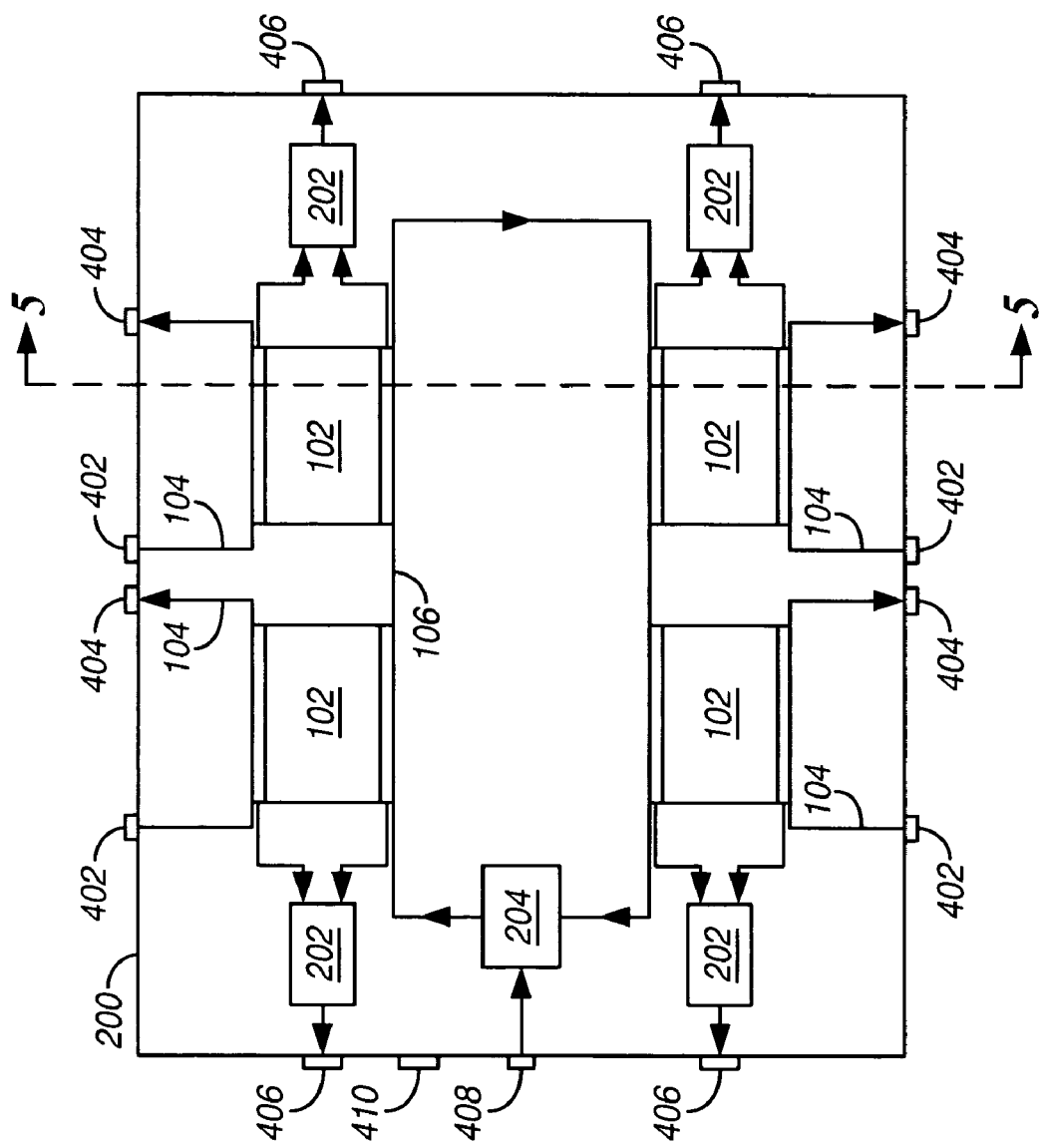
FIG. 4 is a diagrammatic representation of a device incorporating multiple piezoelectric sensors in accordance with certain embodiments of the present invention.

FIG. 4 shows a current sensing device in accordance with a further embodiment of the present invention. The current sensing device is formed on a substrate 200 and incorporates four piezoelectric elements 102. Different numbers of piezoelectric elements may be used. The conductor 106 carries the reference current to all the piezoelectric elements, so only a single current source 204 is required. Multiple current sources may be used if the sensitivities of the current sensors are to be independently controlled. The currents to be measured are coupled to the current input connectors 402 and flow through the conductors 104 to the current output connectors 404. The resulting charges on the piezoelectric elements 202 are collected by charge amplifiers 202 and passed to connectors 406. The reference current produced by the current source (power supply) 204 is controlled by a signal applied to connector 408. Power to the device is supplied to connector 410 and is electrically coupled to the current source 204 and to the charge amplifiers 202. The corresponding connecting circuits are not shown.

Figure 5:
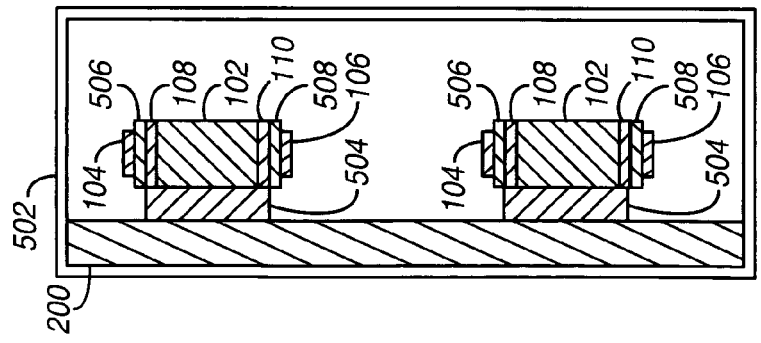
FIG. 5 is a sectional view of a device incorporating multiple piezoelectric sensors in accordance with certain embodiments of the present invention.

FIG. 5 shows a sectional view through the section 5—5 in FIG. 4. In the embodiment shown in FIG. 5, the piezoelectric elements 102 are coupled to the substrate 200 via compliant layers 504. The layers 504 are compliant relative to the piezoelectric elements. The layers support the piezoelectric elements and allow them to deform in response to the stresses applied by the conductors 104 and 106. Stray magnetic fields acting on the conductors 104 and 106 will not induce any compressive or expansive forces on the piezoelectric elements, and will not produce any charges on the conductive layers 108 and 110. However, the device may optionally be shielded with a shield 502 made of Mu metal or other ferrous material to isolate it from stray magnetic fields. The conductors 104 and 106 are electrically isolated from the conductive layers 108 and 110 by insulation layers 506 and 508 respectively.

Figure 6:
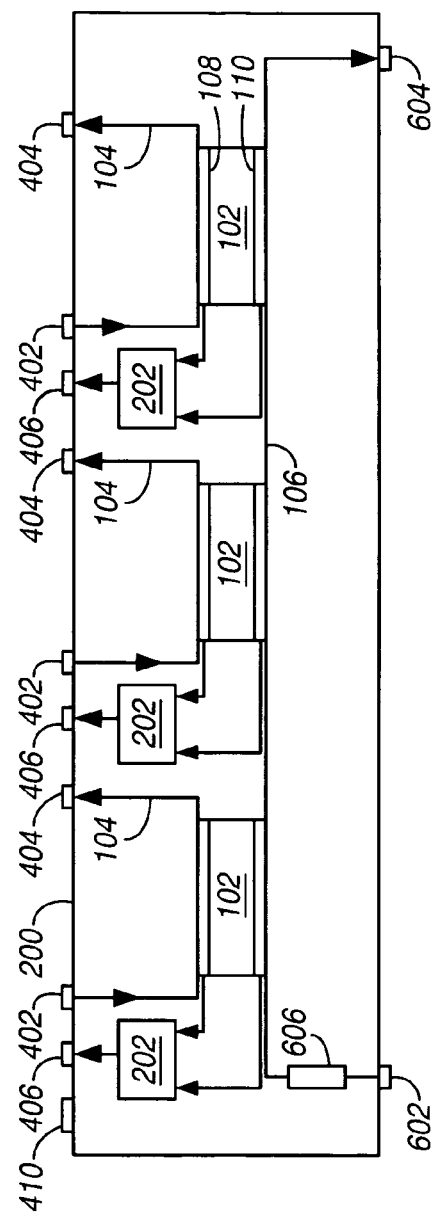
FIG. 6 is a further diagrammatic representation of a device incorporating multiple piezoelectric sensors in accordance with certain embodiments of the present invention.

FIG. 6 shows a current sensing device in accordance with a still further embodiment of the present invention. The current sensing device is formed on a substrate 200 and incorporates three piezoelectric elements 102. Different numbers of piezoelectric elements may be used. The conductor 106 carries the reference current to all the piezoelectric elements. In this embodiment, the reference current is applied to connectors 602 and 604. Equivalently, as discussed above, the circuit may posses a fixed resistance, in which case a reference voltage applied to the connectors 602 and 604 will produce the reference current. The resistance may be provided by a resistor 606 coupled in series with the second conductor. The currents to be measured are coupled to the current input connectors 402 and flow through the conductors 104 to the current output connectors 404. The resulting charges on the piezoelectric elements 102 are collected by charge amplifiers 202 and passed to connectors 406. Power to the device is supplied to connector 410 and is electrically coupled to the charge amplifiers 202. The corresponding connecting circuits on the device are not shown.

The force between the two conductors increases as the conductors are moved closer together. Hence, in one embodiment the piezoelectric current sensor has a small dimension and is made by micro-fabrication techniques. Because of the small size of the sensor, it may be embedded in electronic devices such as microprocessor-based computers, digital signal processors, microcontrollers, dedicated processors, custom circuits, ASICS and other integrated circuits.

Figure 7:
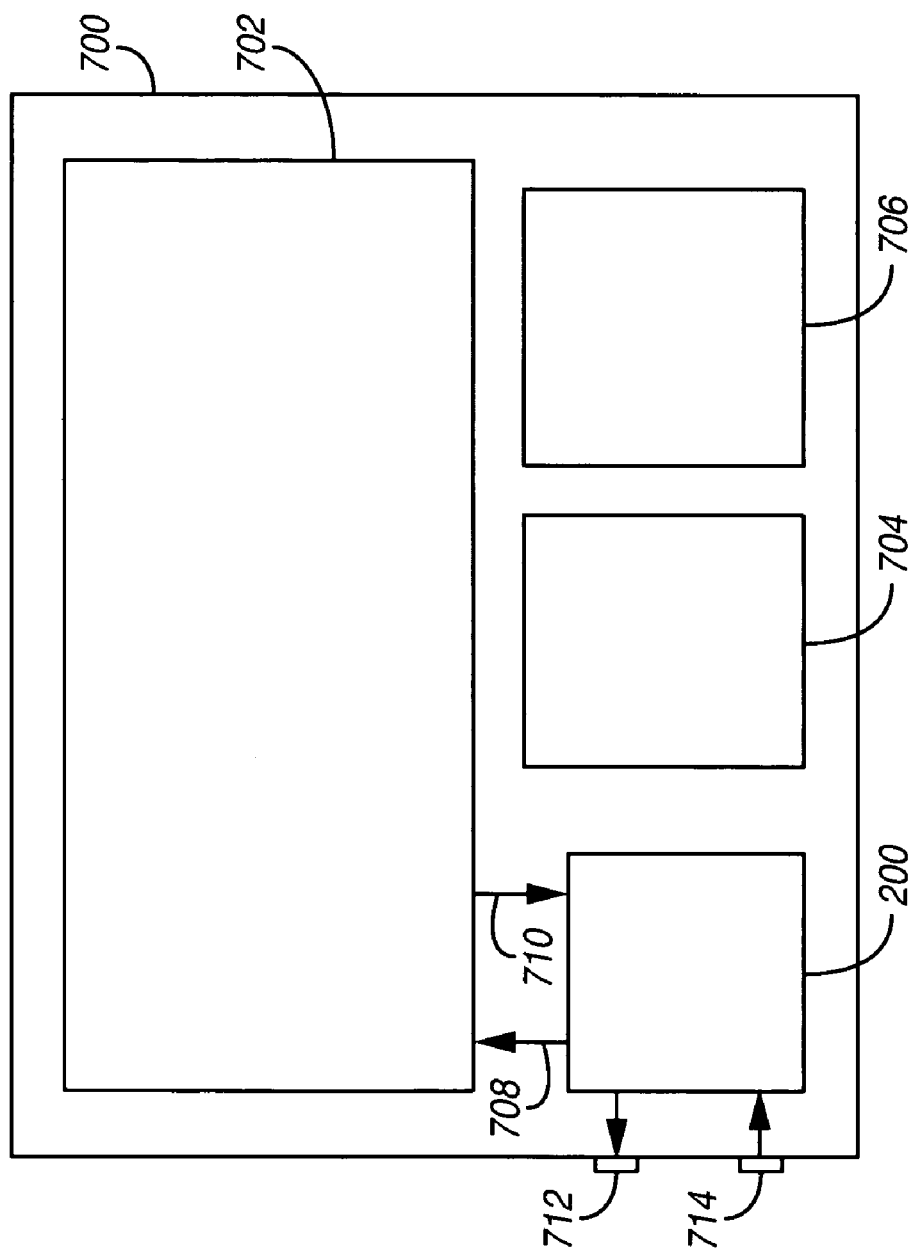
FIG. 7 is a diagrammatic representation of an integrated circuit incorporating a piezoelectric sensor in accordance with certain embodiments of the present invention.

The sensor may be configured as a discrete integrated circuit component or it may be formed as part of an integrated circuit having additional functions. For example, quartz or some other piezoelectric material may be deposited on a silicon substrate along with other electronic components. This enables current measurement to be made directly on a circuit die and allows the current input into specific sections of the circuit to be measured. FIG. 7 is a diagrammatic representation of an integrated circuit incorporating a piezoelectric current sensor. Referring to FIG. 7, a piezoelectric current sensor 200 is incorporated into an electronic device 700 that includes a number of circuit modules 702, 704, 706. Each circuit module contains a number of electronic components. The electronic device 700 may be a single integrated circuit, or a collection of integrated circuits packaged together. In the example shown in the figure, the current sensor 200 is electrically coupled to circuit module 702 via electrical connectors 708 and 710. This enables a current flowing in the circuit module 702 to be measured. The conductor 708 carries to current to be measured to the current sensor 200, while the conductor 710 carries the current back to the circuit module 702. The output from the current sensor 200 may be passed via connectors 712 and 714 to an external monitoring device. Alternatively, a monitoring device may be incorporated into the integrated circuit.

The device, or a representative of a group of devices, may be calibrated by measuring the charge produced by one or more known currents.

If the current to be measured is a direct current, the reference current may be modulated. The modulation is rapid enough that potential across the piezoelectric element does not have time to leak away. For example, the reference current may have a sinusoidal or square wave time dependence. If, for example, a sinusoidal dependence is used, the resulting charge will be sinusoidal, and the amplitude of the measured current will be proportional to the amplitude of the charge. In one embodiment, the square wave reference current is obtained by placing a transistor in series with the resistor ( 606 in FIG. 6, for example) and in series with the second conductor. The transistor is switched by an oscillator, which may be embedded in the device.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A piezoelectric current sensor comprising:
   a piezoelectric element having a first face and a second face;
   a first electrical conductor for carrying a current to be sensed, the first electrical conductor being attached to the first face of the piezoelectric element; and
   a second electrical conductor for carrying a reference current, the second electrical conductor being attached to the second face of the piezoelectric element and aligned substantially parallel to the first electrical conductor;
   wherein a force between the first and second electrical conductors caused by the current to be sensed and the reference current is applied to the piezoelectric element and produces an electrical potential between the first and second faces of the piezoelectric element, and wherein the sensitivity of the piezoelectric current sensor is adjusted by adjusting the level of the reference current.

2. A piezoelectric current sensor in accordance with claim 1, further comprising:
   a first conductive layer attached to the first face of the piezoelectric element; and
   a second conductive layer attached to the second face of the piezoelectric element.

3. A piezoelectric current sensor in accordance with claim 2, further comprising:
   a charge amplifier electrically coupled to the first and second conductive layers and operable to produce an output signal representative of the electrical potential between the first and second faces of the piezoelectric element.

4. A piezoelectric current sensor in accordance with claim 2, wherein the first electrical conductor is electrically isolated from the first conductive layer and the second electrical conductor is electrically isolated from the second conductive layer.

5. A piezoelectric current sensor in accordance with claim 1, further comprising a current source coupled the second electrical conductor and operable to produce the reference current in the second electrical conductor.

6. A piezoelectric current sensor in accordance with claim 5, wherein the current source in operable to adjust the level of the reference current in response to a control signal.

7. A piezoelectric current sensor comprising:
   a piezoelectric element having a first face and a second face;
   a first electrical conductor for carrying a current to be sensed, the first electrical conductor being attached to the first face of the piezoelectric element; and
   a second electrical conductor for carrying a reference current, the second electrical conductor being attached to the second face of the piezoelectric element and aligned substantially parallel to the first electrical conductor;
   wherein a force between the first and second electrical conductors caused by the current to be sensed and the reference current is applied to the piezoelectric element and produces an electrical potential between the first and second faces of the piezoelectric element, and wherein the level of the reference current is modulated to enable measurement of a direct current in the first conductor.

8. A piezoelectric current sensor comprising:
   a piezoelectric element having a first face and a second face;
   a first electrical conductor for carrying a current to be sensed, the first electrical conductor being attached to the first face of the piezoelectric element;
   a second electrical conductor for carrying a reference current, the second electrical conductor being attached to the second face of the piezoelectric element and aligned substantially parallel to the first electrical conductor;
   a substrate; and
   a compliant layer positioned between the piezoelectric element and the substrate and attaching the piezoelectric element to the substrate,
   wherein a force between the first and second electrical conductors caused by the current to be sensed and the reference current is applied to the piezoelectric element and produces an electrical potential between the first and second faces of the piezoelectric element, and wherein the compliant layer is more compliant than the piezoelectric element.

9. A piezoelectric current sensor in accordance with claim 1, further comprising a magnetic shield surrounding the piezoelectric current sensor.

10. A piezoelectric current sensor in accordance with claim 1, wherein the magnetic shield surrounding the piezoelectric current sensor is made of Mu metal.

11. A piezoelectric current sensor comprising:
    a piezoelectric element having a first face and a second face;
    a first electrical conductor for carrying a current to be sensed, the first electrical conductor being attached to the first face of the piezoelectric element;
    a second electrical conductor for carrying a reference current, the second electrical conductor being attached to the second face of the piezoelectric element and aligned substantially parallel to the first electrical conductor; and
    a fixed resistance in series with the second conductor to form a reference circuit
    wherein a force between the first and second electrical conductors caused by the current to be sensed and the reference current is applied to the piezoelectric element and produces an electrical potential between the first and second faces of the piezoelectric element, and wherein the reference current is generated by applying a reference voltage to the reference circuit.

12. An integrated circuit comprising:
    a plurality of electronic components;
    a substrate supporting the plurality of electronic components;
    a plurality of electrical conductors linking one or more of plurality of electronic components;
    a piezoelectric element having a first face and a second face, the first face being attached to a first electrical conductor of the plurality of electrical conductors;
    a second electrical conductor for carrying a reference current, the second electrical conductor being attached to the second face of the piezoelectric element and aligned parallel to the first electrical conductor; and a compliant layer positioned between the piezoelectric element and the substrate and attaching the piezoelectric element to the substrate wherein a force between the first and second electrical conductors is applied to the piezoelectric element and produces an electrical potential between the first and second faces of the piezoelectric element indicative of the current flowing in the first electrical conductor.

13. An integrated circuit in accordance with claim 12, further comprising:
a first conductive layer attached to the first face of the piezoelectric element; and
a second conductive layer attached to the second face of the piezoelectric element.

14. An integrated circuit in accordance with claim 12, further comprising a charge amplifier electrically coupled to the first and second conductive layers and operable to produce an output signal representative of the electrical potential between the first and second faces of the piezoelectric element.

15. An integrated circuit in accordance with claim 13, wherein the first electrical conductor is electrically isolated from the first conductive layer and the second electrical conductor is electrically isolated from the second conductive layer.

16. An integrated circuit in accordance with claim 12, further comprising a current source coupled the second electrical conductor and operable to produce the reference current in the second electrical conductor.

17. A piezoelectric current sensor comprising:
a plurality of piezoelectric elements each having a first face and a second face;
a plurality of first electrical conductors, each of the plurality first electrical conductors being attached to a first face of a piezoelectric element of the plurality of piezoelectric elements and each being capable of carrying a current to be sensed; and
a second electrical conductor for carrying a reference current, the second electrical conductor being attached to the second face of each of the plurality of piezoelectric elements and aligned parallel to a first electrical conductor of the plurality of first electrical conductors,
wherein a force between a first electrical conductor and the second electrical conductor is applied to a corresponding piezoelectric element and produces an electrical potential between the first and second faces of the piezoelectric element.

18. A method for sensing an electrical current in a first conductor of a piezoelectric current sensor, the piezoelectric current sensor further comprising a piezoelectric element having a first face attached to the first conductor and second face attached to a second conductor aligned substantially parallel to the first conductor, the method comprising:
passing a reference current though the second conductor to produce a force between the first and second conductors that is applied to the piezoelectric element;
measuring the voltage potential between the first and second faces of the piezoelectric element; and
adjusting the sensitivity of the piezoelectric current sensor by adjusting the reference current level.

19. A method in accordance with claim 18, wherein measuring the voltage potential between the first and second faces of the piezoelectric element comprises electrically coupling the first and second faces of the piezoelectric element to a charge amplifier and sensing the output from the charge amplifier.

20. A method for sensing an electrical current in a first conductor of a piezoelectric current sensor, the piezoelectric current sensor further comprising a piezoelectric element having a first face attached to the first conductor and second face attached to a second conductor aligned substantially parallel to the first conductor, the method comprising:
passing a reference current though the second conductor to produce a force between the first and second conductors that is applied to the piezoelectric element;
measuring the voltage potential between the first and second faces of the piezoelectric element; and
modulating the reference current level.

21. A method in accordance with claim 20, wherein the reference current level is modulated by one of a sinusoidal wave, a triangular wave, and a square wave.

22. A method for sensing an electrical current in a first conductor of a piezoelectric current sensor, the piezoelectric current sensor further comprising a piezoelectric element having a first face attached to the first conductor and second face attached to a second conductor aligned substantially parallel to the first conductor, the method comprising:
passing a reference current though the second conductor to produce a force between the first and second conductors that is applied to the piezoelectric element;
measuring the voltage potential between the first and second faces of the piezoelectric element; and
determining the current in the first conductor by multiplying the voltage potential by a calibration factor.

23. A method for sensing an electrical current in a first conductor of a piezoelectric current sensor, the piezoelectric current sensor further comprising a piezoelectric element having a first face attached to the first conductor and second face attached to a second conductor aligned substantially parallel to the first conductor, the method comprising:
passing a reference current though the second conductor to produce a force between the first and second conductors that is applied to the piezoelectric element;
measuring the voltage potential between the first and second faces of the piezoelectric element; and
determining the current in the first conductor by multiplying the voltage potential by a calibration factor and dividing by the reference current.

24. A method for sensing an electrical current in a first conductor of a piezoelectric current sensor, the piezoelectric current sensor further comprising a piezoelectric element having a first face attached to the first conductor and second face attached to a second conductor aligned substantially parallel to the first conductor, the method comprising:
passing a reference current though the second conductor to produce a force between the first and second conductors that is applied to the piezoelectric element;
measuring the voltage potential between the first and second faces of the piezoelectric element; and
determining the current in the first conductor by multiplying the voltage potential by a calibration factor and dividing by a reference voltage.

25. A method for sensing an electrical current in a first conductor of a piezoelectric current sensor, the piezoelectric current sensor further comprising a piezoelectric element having a first face attached to the first conductor and second face attached to a second conductor aligned substantially parallel to the first conductor, the method comprising:
passing a reference current though the second conductor to produce a force between the first and second conductors that is applied to the piezoelectric element;
measuring the voltage potential between the first and second faces of the piezoelectric element; and determining a voltage applied across the first conductor dependent upon the electrical resistance of the first conductor and the current in the first sensor.

26. A piezoelectric current sensor comprising:
a piezoelectric element having a first face and a second face;
a first electrical conductor for carrying a current to be sensed, the first electrical conductor being attached to the first face of the piezoelectric element;
a means for generating a reference current;
a second electrical conductor for carrying the reference current, the second electrical conductor being attached to the second face of the piezoelectric element and aligned substantially parallel to the first electrical conductor;
a means for measuring the electrical potential between the first and second faces of the piezoelectric element produced by a force between the first and second electrical conductors that is applied to the piezoelectric element; and
a means for modulating the reference current to facilitate measurement of direct currents in the first conductor.

27. A piezoelectric current sensor comprising:
a piezoelectric element having a first face and a second face;
a first electrical conductor for carrying a current to be sensed, the first electrical conductor being attached to the first face of the piezoelectric element;
a means for generating a reference current;
a second electrical conductor for carrying the reference current, the second electrical conductor being attached to the second face of the piezoelectric element and aligned substantially parallel to the first electrical conductor;
a means for measuring the electrical potential between the first and second faces of the piezoelectric element produced by a force between the first and second electrical conductors that is applied to the piezoelectric element; and
a means for varying the level of the reference current.

28. A piezoelectric current sensor in accordance with claim 27, wherein the means for varying the level of the reference current is operable to vary the level in response to the level of the current to be sensed.

29. A piezoelectric current sensor in accordance with claim 26, wherein the means for measuring the electrical potential between the first and second faces of the piezoelectric element includes first and second conductive layers electrically coupled to the first and second faces of the piezoelectric element respectively and an means for amplifying the charge difference between the first and second conductive layers.

30. A piezoelectric current sensor in accordance with claim 26, further comprising means for electrically coupling the current to be sensed to the first conductor.

31. A piezoelectric current sensor in accordance with claim 26, wherein the piezoelectric element comprises one of quartz crystal, lead zirconate titanate (PZT) ceramic and polyvinylidene fluoride (PVDF) polymer.

32. A method for calibrating a piezoelectric current sensor, comprising:
passing a known direct current $I_0$ through a first electrical conductor attached to a first face of a piezoelectric element;
passing a modulated reference current $I_{REF}$ through a second electrical conductor attached to a second face of the piezoelectric element; and
measuring the level $V_0$ of the output signal from a charge amplifier operable to amplify the electrical potential across the piezoelectric element.

33. A method in accordance with claim 32, further comprising dividing the product of the known current and the reference current by the
level of the output signal to obtain a calibration constant.

$$\alpha = \frac{I_0 \cdot I_{REF}}{V_0},$$

such that in operation the current I in the first conductor is given by $$I = \alpha \frac{V_0}{I_{REF}}.$$

* * * * *

UNITED STATES PATENT AND TRADEMARK OFFICE
CERTIFICATE OF CORRECTION

| | | |
|---|---|---|
| PATENT NO. | : 6,989,623 B2 | Page 1 of 1 |
| APPLICATION NO. | : 10/735197 | |
| DATED | : January 24, 2006 | |
| INVENTOR(S) | : Roy Zeighami | |

It is certified that error appears in the above-identified patent and that said Letters Patent is hereby corrected as shown below:

In column 12, line 30, in Claim 33, after "constant" delete ".".

Signed and Sealed this

Twenty-first Day of July, 2009

JOHN DOLL
*Acting Director of the United States Patent and Trademark Office*